(12) United States Patent
Mueller et al.

(10) Patent No.: US 6,975,141 B2
(45) Date of Patent: Dec. 13, 2005

(54) LVDS DRIVER FOR SMALL SUPPLY VOLTAGES

(75) Inventors: David Mueller, Munich (DE); Anthony Sanders, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/842,985

(22) Filed: May 11, 2004

(65) Prior Publication Data

US 2004/0251882 A1    Dec. 16, 2004

Related U.S. Application Data

(63) Continuation of application No. PCT/EP02/11797, filed on Oct. 22, 2002.

(30) Foreign Application Priority Data

Nov. 12, 2001   (DE) ............................... 101 55 526

(51) Int. Cl.[7] ........................................ H03K 19/0175

(52) U.S. Cl. ........................................ 326/83; 326/86

(58) Field of Search .................................... 326/82–90

(56) References Cited

U.S. PATENT DOCUMENTS

| 5,216,297 | A | * | 6/1993 | Proebsting | ................... | 326/73 |
| 5,977,796 | A |   | 11/1999 | Gabara |   |   |
| 6,137,311 | A |   | 10/2000 | Hedberg |   |   |
| 6,285,232 | B1 |   | 9/2001 | Hasegawa |   |   |
| 6,313,662 | B1 |   | 11/2001 | Ide |   |   |
| 6,437,599 | B1 | * | 8/2002 | Groen | ......................... | 326/63 |
| 6,590,432 | B1 | * | 7/2003 | Wu et al. | ................... | 327/108 |
| 2003/0151438 | A1 | * | 8/2003 | Lye | ............................ | 327/237 |

FOREIGN PATENT DOCUMENTS

| DE | 196 01 386 A1 | 1/1997 |
| DE | 196 28 270 A1 | 1/1998 |
| EP | 0 536 536 A1 | 4/1993 |

* cited by examiner

*Primary Examiner*—Don Le
(74) *Attorney, Agent, or Firm*—Jenkins, Wilson & Taylor, P.A.

(57) ABSTRACT

The invention relates to an LVDS driver for small supply voltages, particularly of less than 2.0 V, for producing a differential output signal (Pout, Nout), having a pull-up transistor (P3, P4) and a pull-down transistor (P1, P2), respectively, for switching the output voltages which are output at the outputs (Pout, Nout). An optimum switching response and hence an undistorted differential signal can be produced by virtue of the pull-up and pull-down transistors (P1–P4) being in the form of PMOS transistors.

8 Claims, 3 Drawing Sheets

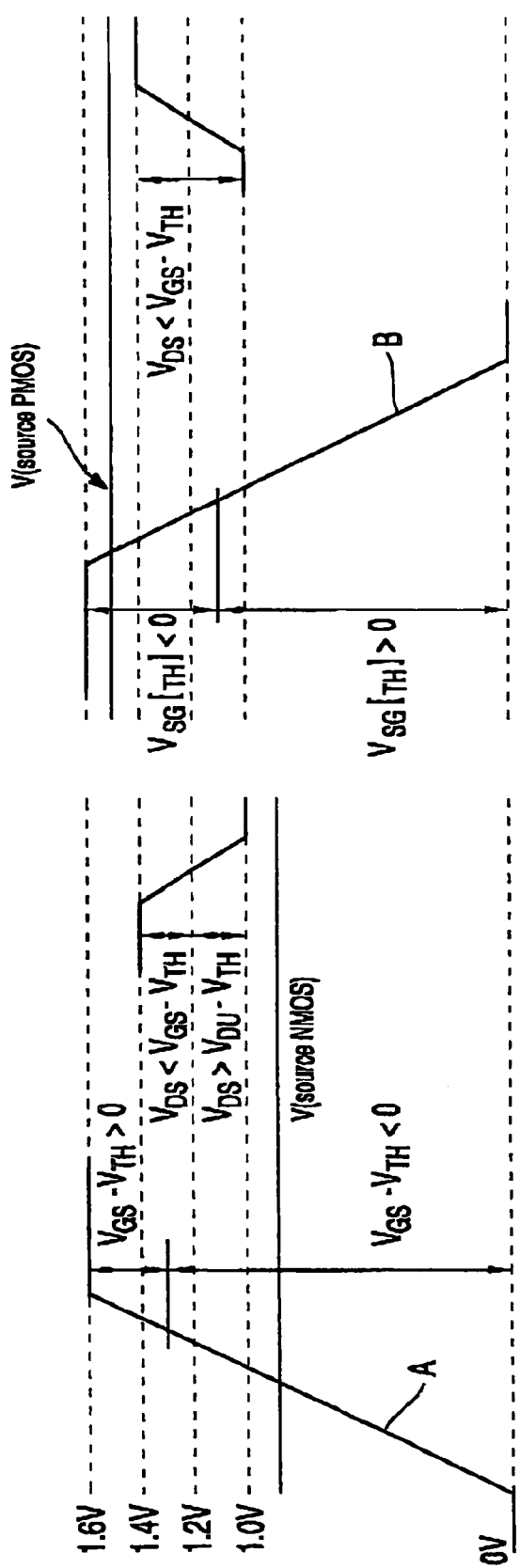

LVDS DRIVER FOR SMALL SUPPLY VOLTAGES

RELATED APPLICATIONS

This application is a continuation of PCT patent application number PCT/EP02/11797, filed Oct. 22, 2002, which claims priority to German patent application number 10155526.1, filed Nov. 12, 2001, the disclosures of each of which are incorporated herein by reference in their entirety.

TECHNICAL FIELD

The invention relates to an LVDS driver for producing a differential output signal in line with the precharacterizing part of Patent claim 1, particularly for applications in which a supply voltage of less than 2 V is available.

BACKGROUND ART

LVDS (Low Voltage Differential Signal) drivers are used, in particular, in SCI (Scalable Coherent Interface) interfaces for transmitting data via point-to-point connections quickly. With SCI interfaces, much higher transmission speeds are achieved than with conventional data buses.

The principles for the shaping and dimensional design of LVDS drivers are specified in IEEE standard 1596.3-1996. An LVDS driver implemented in line with the standard produces a differential signal having a small amplitude of between 250 mV and 400 mV around a common mode voltage of Vcm=1.2 V, for example.

FIG. 1a) shows an example of the output signals which are output at the outputs Pout and Nout of an LVDS driver. As can be seen, the output signals have an amplitude of 400 mV and oscillate symmetrically around a common mode voltage $V_{CM}$=1.2 V.

FIG. 2 shows a typical example of an LVDS driver for a CMOS technology with a supply voltage $V_{DD}$ of approximately 2.5 V. FIGS. 2a, b show a PMOS transistor (FIG. 2a) and an NMOS transistor (FIG. 2b) in the LVDS driver in an enlarged view, with the fundamental currents and voltages present on the components being shown. In this case, the index S stands for "Source", D stands for "Drain" and G stands for "Gate".

The outputs of the LVDS driver shown in FIG. 2 are denoted by Pout and Nout. The outputs produce the output signal shown in FIG. 1a. To connect the output voltage, a pull-up transistor P1 or P2 and a pull-down transistor N1 or N2 are provided at each output Pout and Nout. The transistors P1 and N1, and P2 and N2, are always in the opposite switching position and turn on and off in opposite senses.

If, by way of example, the transistor N1 has been switched to a low impedance, then the transistor P1 is high impedance, and the output Pout is at approximately 1.0 V. In the opposite switching position of the transistors P1, N1, the node Pout is at approximately 1.4 V.

The gate connections of the transistors P1, P2 and N1, N2 are respectively actuated by an input driver 1, 1'. The output signals A, B from the input drivers are likewise in opposite senses.

The LVDS driver 2 shown also comprises a tuning circuit 3 for adjusting the common mode voltage $V_{CM}$.

With low supply voltages $V_{DD}$ of less than 2 V, as arise, by way of example, in IC circuits having a structured density of 0.18 μm and below, an LVDS driver in this configuration may result in problems when producing the differential signal, which are explained below with reference to FIG. 3.

FIGS. 3a) and 3b) respectively show a control signal (left-hand side) which is present at node A or B of the driver in FIG. 2 and also the associated switching edge at the respective signal output Pout or Nout (right-hand side). In this case, FIG. 3a) shows the switching response of the NMOS transistor N1 and FIG. 3b) shows the switching response of the PMOS transistor P2.

In the worst case, the supply voltage $V_{DD}$ is only 1.6 V (it is assumed that the supply voltage can vary between 1.6 V and 2.0 V. The control signal applied to the gate connection of the transistor Ni has an amplitude of 1.6 V. It is subsequently also assumed that the threshold voltage of the two transistors, i.e. the NMOS transistor N1 and the PMOS transistor P2, is $V_{TH}$=400 mV. The source voltage of the transistor N1 is at 0.9 V. The voltage after which the NMOS transistor N1 changes to the low impedance state is thus 0.9 V+0.4 V=1.3 V ($V_{GS}-V_{TH}$>0).

As can be seen in FIG. 3a), the largest portion (81%) of the signal A has already been consumed before the NMOS transistor turns on. Only the remaining 300 mV actually drive the element.

By contrast, the PMOS transistor P2 requires only 31% of the control signal B in order to turn on the element. The source voltage of the transistor P2 is 1.5 V. That is to say that the transistor P2 switches to the low impedance state ($V_{SG}+V_{TH}$>0) at a gate voltage of only $V_G$=1.1 V.

Another difference in the switching response of the NMOS and PMOS transistors N1 and P2 comes from the different operating ranges of the NMOS and PMOS elements. While the PMOS transistor P2 operates essentially in the linear range ($V_{DS}<V_{GS}-V_{TH}$), the NMOS transistor changes from the saturation range ($V_{DS}<V_{GS}-V_{TH}$) to the linear range ($V_{DS}>V_{GS}-V_{TH}$) during the switching process. Since the effective turn-on voltage for the NMOS element ($V_{GS}-V_{TH}$) is small, the NMOS element is saturated at only $V_{DS}$=300 mV. The source potential is approximately $V_S$=0.9 V, which means that the element is already saturated when the drain potential is $V_D$>1.2 V.

These different switching properties of PMOS and NMOS transistors result in switching edges which have different gradients, as shown in FIG. 1b), for example, and thus in distortion of the differential signal.

EP-0 536 536 A1 and U.S. Pat. No. 6,137,311 disclose LVDS drivers for producing a differential output signal at the driver outputs, whose pull-up and pull-down transistors are all in the form of PMOS transistors. However, the LVDS driver shown is not actuated in optimum fashion in relation to power loss and switching response from the PMOS transistors.

SUMMARY OF THE INVENTION

It is therefore the object of the present invention to provide an LVDS driver which has as little power loss as possible and produces a clean differential signal.

This object is achieved by the features specified in Patent claim 1. Further refinements of the invention are the subject matter of subclaims.

A fundamental aspect of the invention is to provide an input driver which outputs control signals for the pull-up and pull-down transistors at reduced amplitude. The maximum amplitude of the control signals A, B is limited to a value after which it is ensured that the PMOS transistors in the main driver are off and which is just above the turn-on threshold voltage, preferably no more than 300 mV and, in particular, no more than 100 mV above the turn-on threshold voltage of the transistors.

This has the advantage that the PMOS transistors in the main driver operate essentially in the linear range and no distortions arise in the differential signal.

In line with one preferred embodiment of the invention, the input driver comprises, at each output, a transistor which is connected to a negative supply.

In line with one preferred embodiment of the invention, the input driver comprises, at each output, a transistor which is connected to a negative supply voltage and a switching transistor for switching the control outputs of the input driver.

The transistors in the input driver are preferably in the form of NMOS transistors.

In line with one preferred embodiment of the invention, the input driver uses the principle of capacitive voltage rise (bootstrapping), with each of the transistors connected to the supply voltage preferably having a bootstrapping capacitor. The bootstrapping capacitors may either be technologically produced capacitors, or alternatively—with an appropriate design for the NMOS transistors—parasitic gate/source capacitances may optionally be used as bootstrapping capacitors.

The control voltage for the PMOS transistors in the driver, which control voltage is output at the outputs of the input driver, is preferably adjustable.

The LVDS driver preferably comprises a tuning circuit for adjusting a common mode voltage.

In addition, the LVDS driver preferably comprises a current source and also a current sink which supply and dissipate a current of essentially the same magnitude. A regulating circuit may be provided for adjusting a particular flow of current through the current source or sink.

BRIEF DESCRIPTION OF THE DRAWINGS

The invention is explained in more detail below by way of example with reference to the appended drawings, in which:

FIG. 1b shows the temporal shift in switching edges in the signal from 1a;

FIGS. 3a, b show voltages on a PMOS transistor and NMOS:transistor in the driver in FIG. 2;

DETAILED DESCRIPTION OF THE INVENTION

Figure 1A:
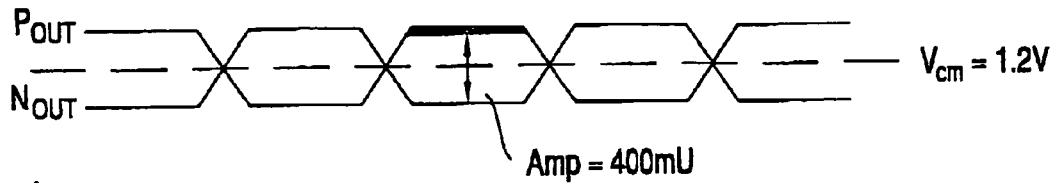
FIG. 1a shows output signals at outputs Pout, Nout on a typical LVDS driver.
Figure 1B:
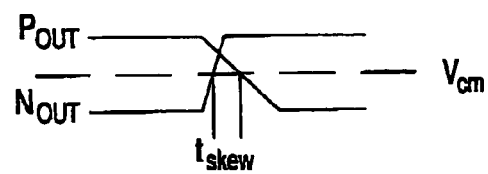
Figure 2:
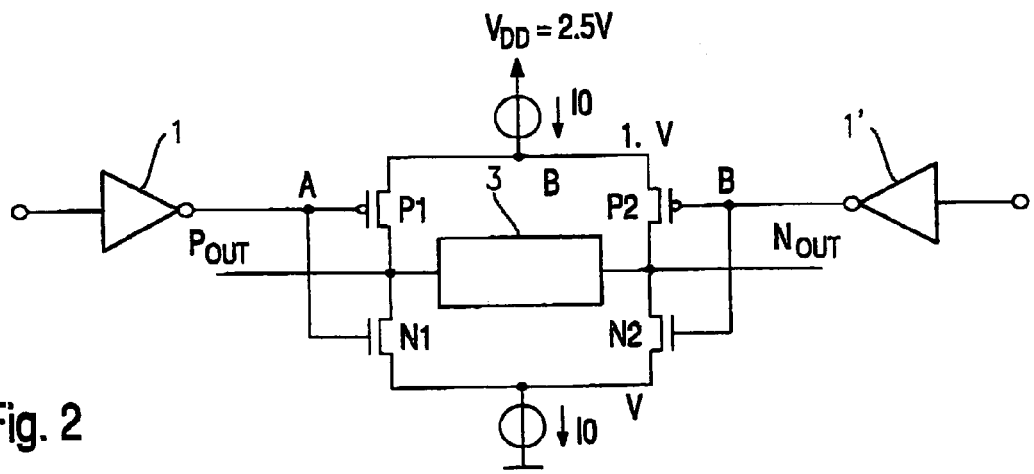
FIG. 2 shows a known LVDS driver.
Figure 2A:
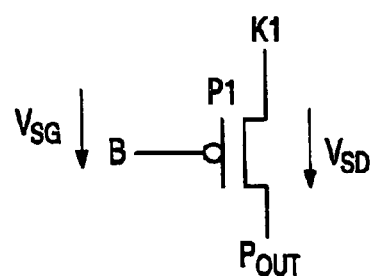
FIGS. 2a, b show enlarged illustrations of an NMOS transistor and a PMOS transistor in the driver in FIG. 2.
Figure 2B:
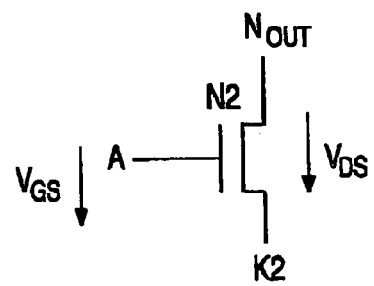

For the description of FIGS. 1–3, reference is made to the introduction to the description.

Figure 4:
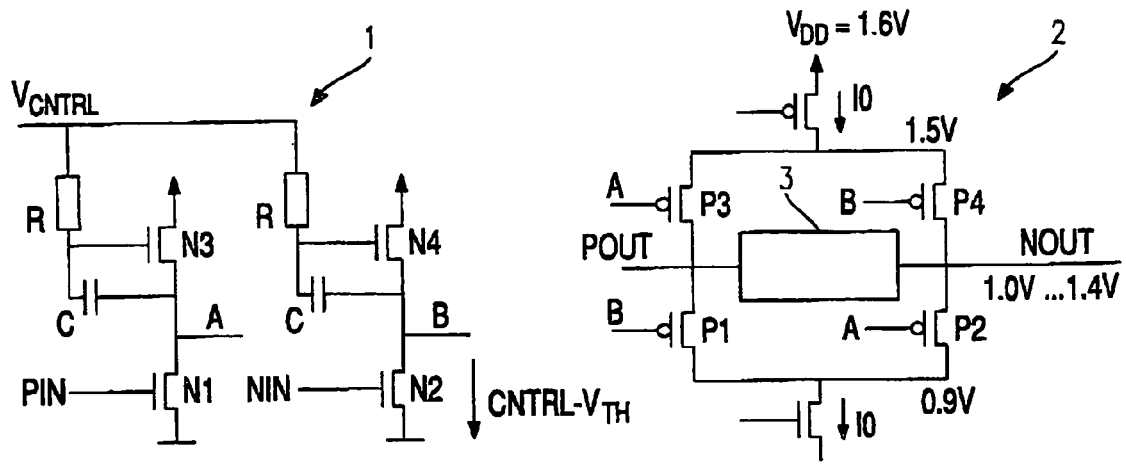
FIG. 4 shows an exemplary embodiment of an LVDS driver having an associated input driver in line with the invention.

FIG. 4 shows an LVDS driver 2 having an associated input driver 1. The LVDS driver 2 essentially comprises four PMOS transistors P1–P4 for producing a differential output signal between the outputs Pout and Nout.

The signal voltage which is output at the outputs Pout and Nout fluctuates around a common mode voltage of approximately 1.2 V with a maximum amplitude Amp=400 mV, as shown in FIG. 1a).

To produce a high output level (1.4 V) for the signal Pout or Nout, the pull-up transistors P3, P4 are switched to low impedance and the pull-down transistors P1, P2 are switched to high impedance. To produce a low output level (1.0 V), the pull-down transistors P1, P2 are switched to low impedance and the pull-up transistors P3, P4 are switched to high impedance. A tuning circuit 3 is used for adjusting the common mode voltage $V_{CM}$ and for terminating the driver 2. In addition, a current source 4 and a current sink 5 are provided which supply and dissipate a current of essentially the same magnitude. The current source 4 and the current sink 5 are shown schematically as PMOS and NMOS transistors in this case.

The pull-up transistors P3, P4 and the pull-down transistors P1, P2 are controlled by control signals A, B which are produced in a push-pull manner by the input driver 1.

Figure 5A:
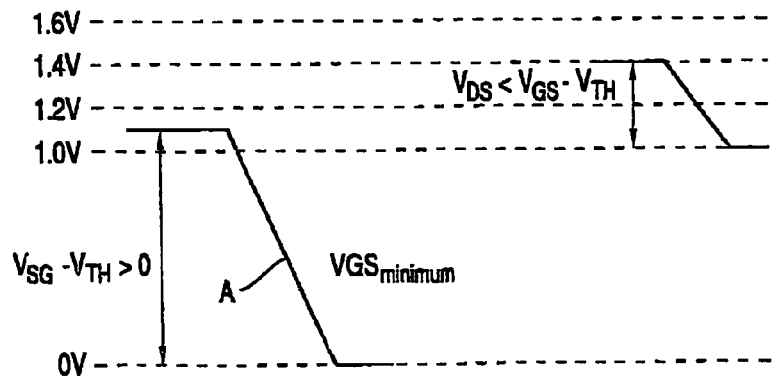
FIGS. 5a and b show signal profiles for the input and output signals in the LVDS driver in FIG. 2.

An example of a pull-up switching operation and a pull-down switching operation is shown in FIGS. 5a) and 5b). FIG. 5a) shows a switching edge in the control signal A from 1.1 V to 0 V. The pull-down switching operation produced in the process is explained below with reference to the transistor P2.

The transistor P2 has a maximum source voltage of 1.4 V. At a threshold voltage of $V_{TH}$=400 mV, a turn-off threshold voltage of 1.0 V ($V_{SG}-|V_{TH}|<0$) is thus obtained. To ensure that the transistor P2 is in the off state, the maximum amplitude of the control signal A has been adjusted to a value just above the turn-off or turn-on threshold voltage, in the present case to 1.1 V. The voltage produced at the output Nout behaves in line with the signal profile at the top right of FIG. 5a), with the output voltage at the node Nout being pulled down from 1.4 V to 1.0 V. In this case, the transistor P2 operates essentially in the linear range.

Figure 5B:
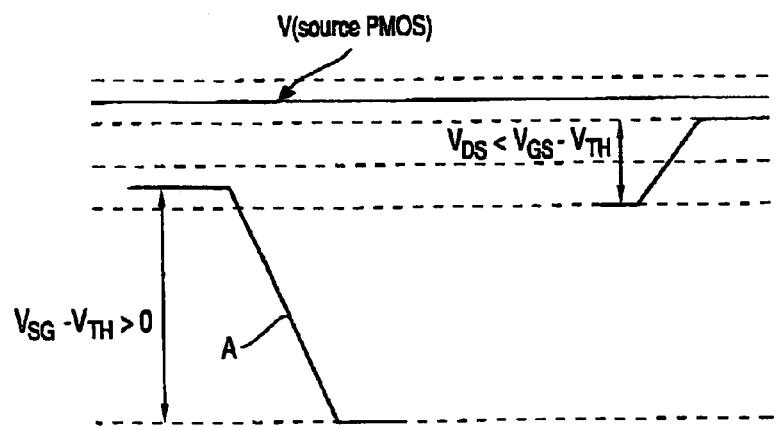

FIG. 5b) shows the pull-up switching operation simultaneously taking place at the output Pout of the driver 2. The control signal A which is on the gate connection of P3 switches from 1.1 V to a level of 0 V. To switch the transistor P3 to low impedance, however, only the signal range between 1.1 and 1.0 V is required. In this case too, the pull-up transistor P3 operates essentially in the linear range. The voltage produced at the output Pout behaves in line with the signal profile at the top right of FIG. 5b), with the output voltage at the node Pout being pulled up from 1.0 V to 1.4 V.

The input driver 1 shown in FIG. 4 comprises a respective transistor N3, N4 connected to a supply voltage and also a respective switching transistor N1, N2 for switching the control signals between 0V and a maximum level. The switching transistors N1, N2 are actuated by an input voltage PIN or NIN. All of the transistors N1-N4 are in the form of NMOS transistors.

For the transistors N3, N4 connected to the supply voltage, the principle of capacitive voltage rise (bootstrapping) is used to speed up the switching operation. To this end, capacitors C are respectively provided between the gate connection and the source connection of the transistors N3, N4. The parasitic impedances $C_{GS}$ which exist anyway can be used as bootstrapping capacitances C if, accordingly, the transistors N3, N4 are given sufficiently large dimensions. In this case, additional bootstrapping capacitances C are no longer required.

The capacitances C and resistors R form a time constant for the capacitive voltage rise (bootstrapping). In this context, the time constant needs to be smaller than the bit period in order to avoid intersymbol interference (ISI)

The control inputs of the transistors N3, N4 are actuated by a control voltage $V_{CNTRL}$ which can be used to set the maximum voltage on the nodes A, B. This makes it possible to adjust the control voltage on the nodes A, B.

| List of reference symbols | | |
|---|---|---|
| | 1, 1' | Input driver |
| | 2 | LVDS driver |
| | 3 | Tuning circuit |
| | 4 | Current source |
| | 5 | Current sink |
| | Pout | Positive output signal |
| | Nout | Negative output signal |
| | $V_{CM}$ | Common mode voltage |
| | A, B | Control signals |
| | P1, P2 | Pull-down transistors |
| | P3, P4 | Pull-up transistors |
| | $V_{DS}$ | Drain/source voltage |
| | $V_{GS}$ | Gate/source voltage |
| | $V_{TH}$ | Threshold voltage |

What is claimed is:

1. LVDS driver for producing a differential output signal at driver outputs, having a pull-up transistor and a pull-down transistor, respectively, for switching the output voltages which are output at the outputs, where the pull-up and pull-down transistors are in the form of PMOS transistors, wherein the LVDS driver has an input driver which outputs control signals for controlling the pull-up and pull-down transistors, whose maximum amplitude is limited to a value which is just above the turn-on threshold voltage of the PMOS transistors, wherein the input driver has, for each control signal, a transistor connected to a supply voltage and a switching transistor, respectively, and wherein the transistors of the input driver are in the form of NMOS transistors.

2. LVDS driver according to claim 1, wherein the LVDS driver operates at a supply voltage of less than 2 V.

3. LVDS driver according to claim 1, wherein the maximum amplitude of the control signals is no more than 300 mV, preferably no more than 100 mV, above the turn-on threshold voltage of the pull-up transistors or of the pull-down transistors.

4. LVDS driver according to claim 1, wherein the transistors connected to a supply voltage have a bootstrapping capacitor.

5. LVDS driver according to claim 1, wherein the transistors connected to a supply voltage are controlled by means of a control voltage.

6. LVDS driver according to claim 1, wherein the LVDS driver has a tuning circuit for adjusting a common mode voltage.

7. LVDS driver according to claim 1, wherein the LVDS driver has a current source and a current sink which supply and dissipate a current of essentially the same magnitude.

8. LVDS driver according to claim 7, wherein a regulating circuit for adjusting the current source and/or the current sink to a prescribed flow of current is provided.

* * * * *